(12) United States Patent
Borer et al.

(10) Patent No.: US 6,342,850 B1
(45) Date of Patent: Jan. 29, 2002

(54) SUMMATION OF BAND-LIMITED ADC OUTPUTS HAVING DIFFERENT RESOLUTIONS AND RATES

(75) Inventors: Timothy John Borer, Surry; Gary Bryan Wordsworth, S. Bucks; David Christopher Clarkson, Berks, all of (GB)

(73) Assignee: Innovision Limited, Woking (GB)

(*) Notice: Subject to any disclaimer, the term of this patent is extended or adjusted under 35 U.S.C. 154(b) by 0 days.

(21) Appl. No.: 09/660,180

(22) Filed: Sep. 12, 2000

(30) Foreign Application Priority Data

Sep. 17, 1999 (CA) ............................................... 2282776

(51) Int. Cl.[7] ................................................. H03M 1/12
(52) U.S. Cl. ....................... 341/156; 341/155; 348/397.1
(58) Field of Search ................................ 341/155, 156; 348/397.1, 398.1, 399.1

(56) References Cited

U.S. PATENT DOCUMENTS 6,084,539 A * 7/2000 Yamada ...................... 341/155

* cited by examiner

Primary Examiner—Howard L. Williams
(74) Attorney, Agent, or Firm—Dimock Stratton Clarizio; Mark B. Eisen

(57) ABSTRACT

A high speed analog-to-digital converter utilizes a fine resolution ADC to digitize the low band component of an analog video signal to produce a fine resolution signal and a coarse resolution ADC to digitize the full spectrum of the analog signal and produce a coarse resolution signal. The coarse resolution signal is subtracted from the fine resolution signal to generate a summed signal containing a quantization error, which is filtered through a low pass digital filter to filter out the high band component and pass the quantization error. The filter output is summed with the coarse resolution signal to restore the fine resolution of the low band, producing a digital output signal that has a resolution suitable for high definition applications.

16 Claims, 1 Drawing Sheet

SUMMATION OF BAND-LIMITED ADC OUTPUTS HAVING DIFFERENT RESOLUTIONS AND RATES

FIELD OF INVENTION

This invention relates to analog to digital converters. In particular, this invention relates to a method and apparatus for high speed, high definition analog to digital conversion of a video signal for use in telecine transfer and other video conversion processes.

BACKGROUND OF THE INVENTION

Telecine transfer is a process by which a cinematographic film is transferred to video. A telecine apparatus scans a negative or print of a cinematographic film and produces an analog video signal comprising a sequence of values representing the brightness and colour of each image position in the scan. An analog-to-digital converter is used to digitize the analog video signal for storage on a media such as magnetic tape or video disc.

Existing telecine systems represent a trade-off between speed and resolution. When the analog signal is converted to a digital signal, the quantization level of the analog to digital converter (ADC) determines the transfer speed and the resultant resolution of the digital image. For example, an 8 bit ADC digitizes an analog signal at a higher rate than a 12 bit ADC but provides significantly lower resolution.

This balance becomes particularly important in the case of high definition video, which requires a relatively higher quantization resolution in order to accommodate the increased resolution of the image. In prior art analog to digital converters higher resolution can only be achieved at the expense of the transfer rate.

Some prior art systems have combined fine and coarse resolution analog-to-digital converters in an attempt to increase the resolution of the digitized signal without substantially reducing the conversion rate.

For example, U.S. Pat. No. 5,053,771 issued on Oct. 1, 1991 to McDermott, which is incorporated herein by reference, discloses an analog-to-digital converter that utilizes an input signal range selection device to select segments of the input signal for digitization using a finer resolution converter, based on the asymmetric distribution of image information in the analog signal. Setup parameters are stored during a "pre-scan" operation which selects those segments of each scene that require higher resolution scanning, and during the transfer process these parameters are used to control the conversion of selected segments of each scene by switching between coarse and fine resolution ADC's.

This technique effectively pre-scans the film to determine which segments of the scene exposure sequence require a finer quantization to preserve the resolution of the image, and uses this information to control the quantization resolution during actual digitization. However, pre-scanning the film is a time consuming step, and the need to isolate scene segments for fine resolution conversion and control digitization using a prearranged sequence of control signals complicates the converter considerably.

It would accordingly be advantageous to provide an analog to digital converter which provides the high definition of a fine resolution ADC without sacrificing the speed of the conversion or introducing additional steps into the conversion process.

SUMMARY OF THE INVENTION

The present invention provides a method and apparatus for converting an analog signal to a digital signal, utilizing an analog to digital converter which provides a high resolution video image suitable for high definition applications at a conversion rate comparable to that of a lower resolution ADC.

The invention accomplishes this by providing an analog to digital converter comprising a diplexer filter which utilizes a fine resolution ADC to digitize the low band component of the analog video signal, and a coarse resolution ADC to digitize the full spectrum of the analog video signal. The coarse resolution signal is subtracted from the fine resolution signal to create a summed signal that includes the difference between the low band components of the respective ADC outputs. The summed signal is filtered through a low pass digital filter to filter out the high band components and pass the quantization error. The coarse resolution signal is delayed as necessary to match any delay in the filter, and the quantization error is added to the output of the coarse resolution ADC to effectively restore the 12 bit resolution of the low band component. The output is a digital signal having a resolution suitable for high definition applications such as HDTV.

The present invention thus provides a method of converting an analog signal to a digital signal, comprising the steps of digitizing a low band component of the analog signal to produce a fine resolution signal, digitizing high and low band components of the analog signal to produce a coarse resolution signal, subtracting the coarse resolution signal from the fine resolution signal to produce a summed signal containing a difference between low band components of the fine resolution signal and the coarse resolution signal, filtering the summed signal through a low pass digital filter to eliminate high band components of the summed signal and pass the difference between low band components, and summing the filtered signal with the coarse resolution signal to produce a digital output signal.

The present invention further provides a converter for converting an analog signal to a digital signal, comprising a fine resolution analog to digital converter for digitizing a low band component of the analog signal and producing a fine resolution digital signal, a coarse resolution analog to digital converter for digitizing high and low band components of the analog signal and producing a coarse resolution digital signal, a processor for subtracting the coarse resolution signal from the fine resolution signal to produce a summed signal containing a difference between low band components of the coarse resolution signal and the fine resolution signal, a low pass digital filter for eliminating a high band component of the summed signal and passing the difference between low band components, and a processor for adding the filtered signal to the coarse resolution signal to produce a digital output signal.

In a preferred embodiment of the invention the fine resolution ADC samples at a lower sampling rate than the coarse resolution ADC and the fine resolution signal is upsampled to the sampling rate of the coarse resolution signal before summing.

In a further preferred embodiment a delay is provided to delay the fine resolution signal to match any delay in the low pass digital filter before summing the quantization error and the coarse resolution signal.

BRIEF DESCRIPTION OF THE DRAWINGS

In drawings which illustrate by way of example only a preferred embodiment of the invention.

DETAILED DESCRIPTION OF THE INVENTION

Figure 1:
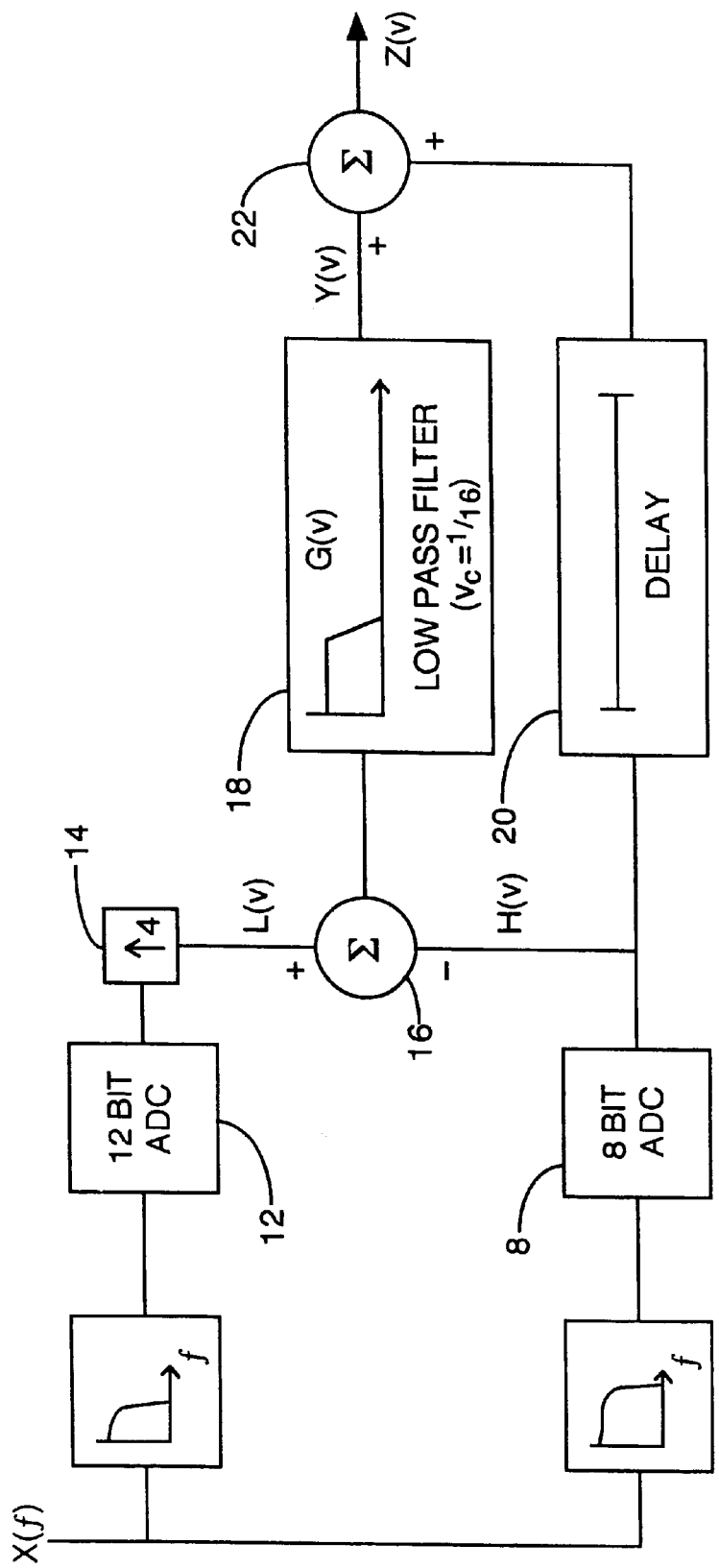
FIG. 1 is a schematic diagram illustrating an analog to digital filter according to the invention.

The invention digitizes an analog input signal X(f) representing the film density of each image position scanned in a scene from a cinematographic film or negative, for example by a scanner in a telecine apparatus. The film density information in the analog signal is related to corresponding values for conversion into a digital signal, as is described in U.S. Pat. No. 5,053,771 issued to McDermott on Oct. 1, 1991, which is incorporated herein by reference. The invention may be used to digitize any analog signal, and is particularly advantageously used in the digitization of a video signal including a signal generated by an imaging orthicon or stored on magnetic tape or other media.

According to the invention, the analog input signal X(f) is processed in parallel by a coarse resolution ADC 8 and a fine resolution ADC 12.

The coarse resolution ADC 8 digitizes the full spectrum of the input signal X(f), and outputs a coarse resolution signal containing both low and high band components. The fine resolution ADC 12 digitizes only the low band component of the input signal X(f) (for example, up to 20 MHz).

In the embodiment illustrated the coarse resolution ADC 8 outputs a coarse resolution signal at a sampling rate of 160 MSamples/s and the fine resolution ADC 12 outputs a fine resolution signal at a sampling rate of 40 MSamples/s. In the preferred embodiment illustrated the sampling rate of the coarse resolution ADC 8 is an integral multiple of the sampling rate of the fine resolution ADC 12, and the fine resolution signal is upsampled through an interpolator 14 by a factor of four, to match the 160 MSamples/s sampling rate of the coarse resolution signal.

The fine resolution ADC 12 outputs a fine resolution signal which is upsampled by the interpolator 14 to produce a fine resolution signal L(v) consisting of the primary spectrum $L_o(v)$ and the image spectra $L_I(v)$:

$$L(v)=L_o(v)+L_I(v) \tag{1}$$

where v is the normalized frequency referred to the sampling rate of the coarse resolution ADC 8.

The coarse resolution ADC 8 outputs a coarse resolution signal H(v), which consists of a low band component $H_L(v)$ and a high band component $H_H(v)$:

$$H(v)=H_L(v)+H_H(v) \tag{2}$$

$H_L(v)$ contains the same low band component present in the primary spectrum $L_o(v)$ of the fine resolution signal. However, $H_L(v)$ is quantized to 8 bits while $L_o(v)$ is quantized to 12 bits. The difference between $H_L(v)$ and $L_o(v)$ can be considered a quantization error $\epsilon(v)$, such that $$H_L(v)=L_o(v)+\epsilon(v) \tag{3}$$

Substituting equation (3) into equation (2), the coarse resolution output H(v) can be expressed as $$H(v)=L_o(v)+\epsilon(v)+H_H(v). \tag{4}$$

The fine resolution signal L(v) and the coarse resolution signal H(v) are processed by a processor 16 comprising an inverter/adder, which subtracts the coarse resolution signal H(v) from the fine resolution signal L(v) by generating a complement of H(v) and summing the complementary signal −H(v) with the fine resolution signal L(v) to produce a summed signal L(v)−H(v). The summed signal L(v)−H(v) consists of the high band components of $L_I(v)$ and $-H_H(v)$, and a quantization error $-\epsilon(v)$:

$$L(v)-H(v)=L_o(v)+L_I(v)-(L_o(v)+\epsilon(v)+H_H(v)) \tag{5}$$

or $$L(v)-H(v)=L_o(v)+L_I(v)-L_o(v)-\epsilon(v)-H_H(v) \tag{6}$$

or $$L(v)-H(v)=L_I(v)-\epsilon(v)-H_H(v) \tag{7}$$

The summed signal L(v)−H(v) is processed though a low pass digital filter 18, in the preferred embodiment illustrated sampling at 160 MSamples/s and having a cutoff frequency $v_c$ of approximately 10 MSamples/s. The filter 18 eliminates the high band components $L_I(v)$ and $-H_H(v)$ and passes the low band quantization error $-\epsilon(v)$, outputting a signal Y(v) represented by $$Y(v)=G(v)[L(v)-H(v)] \tag{8}$$

where G(v) is the frequency response of the low pass filter 18.

Substituting equation (7) into equation (8), yields $$Y(v)=G(v)[L_I(v)-\epsilon(v)-H_H(v)] \tag{9}$$

Since at high frequencies G(v)≡0, the low pass filter 18 eliminates ($L_I(v)-H_H(v)$), the high band component of the summed signal, and passes the quantization error $-\epsilon(v)$. The coarse resolution signal H(v) is delayed by a digital delay 20 as necessary to match any delay in the summed signal L(v)−H(v) caused by the filter 18, and adder 22 sums the output Y(v) of the filter 18, which is essentially the quantization error $-\epsilon(v)$, with the coarse resolution signal H(v) to produce the digital output signal Z(v).

Summing the quantization error $-\epsilon(v)$ with the coarse resolution signal $H_L(v)$ produces $H_L(v)-\epsilon(v)$, which is essentially the desired fine resolution low band output signal $L_o(v)$ (see equation 3). This can be shown as follows:

$$Z(v)=Y(v)+H(v) \tag{10}$$

Substituting equations (4) and (9) into equation (10) yields $$Z(v)=G(v)[L_I(v)-\epsilon(v)-H_H(v)]+L_o(v)+\epsilon(v)+H_H(v) \tag{11}$$

or $$Z(v)=G(v)L_I(v)-G(v)\epsilon(v)-G(v)H_H(v)+L_o(v)+\epsilon(v)+H_H(v) \tag{12}$$

or $$Z(v)=L_o(v)+H_H(v)[1-G(v)]+\epsilon(v)[1-G(v)]+L_I(v)G(v) \tag{13}$$

At the low frequencies passed by the low pass filter 18, G(v)≡1 and $L_I(v)=0$ (by definition). Thus, the high band component $H_H(v)$ and the quantization error $\epsilon(v)$ are eliminated, leaving $$Z(v)=L_o(v) \tag{14}$$

In effect, summing the coarse resolution signal complement $-H_L(v)$ with the fine resolution signal $L_o(v)$ generates a quantization error $\epsilon(v)$ (or $-\epsilon(v)$) representing the difference between the low frequency components of the coarse and fine resolution signals H(v) and L(v). At the low frequencies of the low pass filter 18 the quantization error $-\epsilon(v)$ passes through the filter 18 and is recombined with $H_L(v)$ at the filter output to reconstitute the fine resolution low band output $L_o(v)$. At high frequencies the output of the low pass filter 18 is essentially zero, so the high band component of $Z(v)$ is $H_H(v)$ directly from the coarse resolution ADC 8. By using a fine resolution ADC 12 to quantize only the low band component of the analog input signal, the high speed of the transfer process is retained without detracting from the resolution of the output signal.

The fine resolution ADC 12 outputs a high resolution, low bandwidth (i.e. low noise but visually soft) signal, while the coarse resolution ADC 8 outputs a low resolution, high bandwidth (i.e. noisy but visually sharp) signal. Combining the outputs of the coarse and fine ADC's 8, 12 according to the invention optimizes the use of the ADC's 8, 12 in the frequency range most appropriate for each particular ADC 8 or 12. At low frequencies the output signal $Z(v)$ is derived completely from the fine resolution ADC 12, and at high frequencies the output signal $Z(v)$ is derived completely from the coarse resolution ADC 8.

The characteristics of the filter 18 determine the extent to which each ADC 8 or 12 contributes to the output signal $Z(v)$ in the transition region, i.e. where $0<|G(v)|<1$, within which both ADC's 8 and 12 contribute to the output signal $Z(v)$. In the transition region of the filter 18 the effective number of bits ranges from 12 bits within the passband of the filter 18, through 11, 10 and 9 bits within the transition region, to 8 bits in the stop band of the filter 18. The converter of the invention thus provides a smooth transition between high resolution at low frequencies and low resolution at high frequencies.

A preferred embodiment of the invention having been thus described by way of example only, it will be apparent to those skilled in the art that certain modifications and adaptations may be made without departing from the scope of the invention. The invention is intended to include all such modifications as fall within the invention as set out in the appended claims.

We claim:

1. A method of converting an analog signal to a digital signal, comprising the steps of digitizing a low band component of the analog signal to produce a fine resolution signal, digitizing high and low band components of the analog signal to produce a coarse resolution signal, subtracting the coarse resolution signal from the fine resolution signal to produce a summed signal containing a difference between low band components of the fine resolution signal and the coarse resolution signal, filtering the summed signal through a low pass digital filter to eliminate high band components of the summed signal and pass the difference between low band components, and summing the filtered signal with the coarse resolution signal to produce a digital output signal.

2. The method of claim 1 including the step of delaying the coarse resolution signal to match a delay caused by the filter before the step of summing the filtered signal with the coarse resolution signal.

3. The method of claim 2 in which the fine resolution signal is sampled at a first sampling rate and the coarse resolution signal is sampled at a second sampling rate which is higher than the first sampling rate, wherein the fine resolution signal is upsampled to match the sampling rate of the coarse resolution signal.

4. The method of claim 3 in which the second sampling rate is an integer multiple of the first sampling rate.

5. The method of claim 2 in which the fine resolution signal is produced by a twelve bit analog to digital converter.

6. The method of claim 2 in which the coarse resolution signal is produced by an eight bit analog to digital converter.

7. The method of claim 3 in which the fine resolution signal is upsampled by an interpolator.

8. The method of claim 1 in which the analog signal comprises a video signal.

9. A converter for converting an analog signal to a digital signal, comprising a fine resolution analog to digital converter for digitizing a low band component of the analog signal and producing a fine resolution digital signal, a coarse resolution analog to digital converter for digitizing high and low band components of the analog signal and producing a coarse resolution digital signal, a processor for subtracting the coarse resolution signal from the fine resolution signal to produce a summed signal containing a difference between low band components of the coarse resolution signal and the fine resolution signal, a low pass digital filter for eliminating a high band component of the summed signal and passing the difference between low band components, and a processor for adding the filtered signal to the coarse resolution signal to produce a digital output signal.

10. The converter of claim 9 including a delay for delaying the coarse resolution signal to match a delay caused by the filter before summing the filtered signal with the coarse resolution signal.

11. The converter of claim 10 in which the fine resolution analog to digital converter samples at a first sampling rate and the coarse resolution analog to digital converter samples at a second sampling rate which is higher than the first sampling rate, wherein the fine resolution signal is upsampled to match the sampling rate of the coarse resolution signal.

12. The converter of claim 11 in which the second sampling rate is an integer multiple of the first sampling rate.

13. The converter of claim 10 in which the fine resolution analog to digital converter is a twelve bit analog to digital converter.

14. The converter of claim 10 in which the coarse resolution analog to digital converter is an eight bit analog to digital converter.

15. The converter of claim 11 comprising an interpolator for upsampling the fine resolution signal.

16. The converter of claim 9 in which the analog signal comprises a video signal.

* * * * *